United States Patent
Kuehn

(10) Patent No.: US 8,762,090 B2
(45) Date of Patent: Jun. 24, 2014

(54) METHOD TO CONFIGURE AT LEAST A PARTIAL RANGE OF A PULSE SEQUENCE OF A MAGNETIC RESONANCE DEVICE

(75) Inventor: Bernd Kuehn, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 493 days.

(21) Appl. No.: 12/964,093

(22) Filed: Dec. 9, 2010

(65) Prior Publication Data
US 2011/0137598 A1    Jun. 9, 2011

(30) Foreign Application Priority Data
Dec. 9, 2009   (DE) .......................... 10 2009 057 582

(51) Int. Cl.
*G01D 18/00* (2006.01)
*G01V 3/00* (2006.01)

(52) U.S. Cl.
USPC ........................................... 702/85; 324/312

(58) Field of Classification Search
USPC ........... 702/85, 22, 27–32; 324/309, 312, 314
See application file for complete search history.

(56) References Cited

U.S. PATENT DOCUMENTS

| | | | |
|---|---|---|---|
| 4,707,661 A | 11/1987 | Hoenninger, III et al. | |
| 5,144,242 A | 9/1992 | Zeilenga et al. | |
| 5,519,320 A | 5/1996 | Kanayama et al. | |
| 6,249,120 B1 | 6/2001 | McKinnon et al. | |
| 6,348,793 B1 * | 2/2002 | Balloni et al. | 324/309 |
| 6,636,038 B1 * | 10/2003 | Heid | 324/314 |
| 7,078,900 B2 | 7/2006 | Vu | |
| 7,081,750 B1 * | 7/2006 | Zhang | 324/309 |
| 7,847,550 B2 | 12/2010 | Diehl et al. | |
| 7,894,877 B2 * | 2/2011 | Lewin et al. | 600/424 |
| 2004/0263166 A1 | 12/2004 | Kluge | |

OTHER PUBLICATIONS

"ODIN-Object-Oriented Development Interface for NMR," Jochimsen et al., Elsevier (2004).
"Pulse Sequence Programming in a Dynamic Visual Environment," Magland et al., Proc. Intl. Soc. Mag. Reson. Med., vol. 14 (2006), p. 352.

* cited by examiner

*Primary Examiner* — Sujoy Kundu
*Assistant Examiner* — Ricky Ngon
(74) *Attorney, Agent, or Firm* — Schiff Hardin LLP

(57) ABSTRACT

In a method to configure at least one partial range of a pulse sequence for operating a magnetic resonance device, the pulse sequence is composed of at least two different program units, and information and/or at least one parameter is exchanged between the individual program units by a computerized mediator unit.

9 Claims, 2 Drawing Sheets

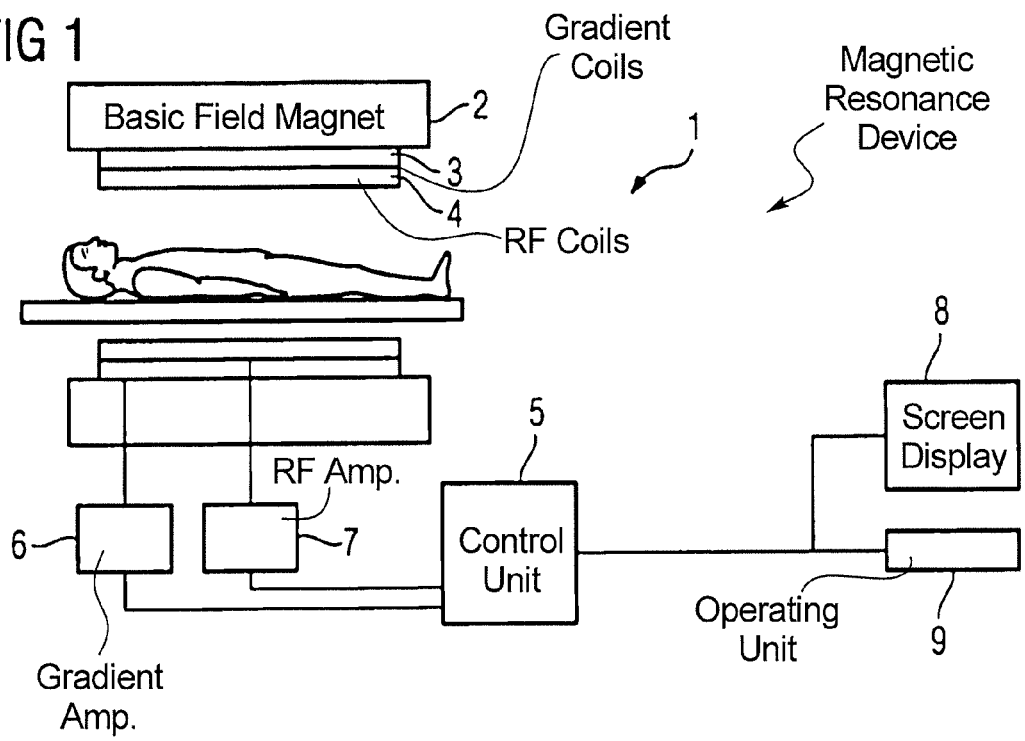
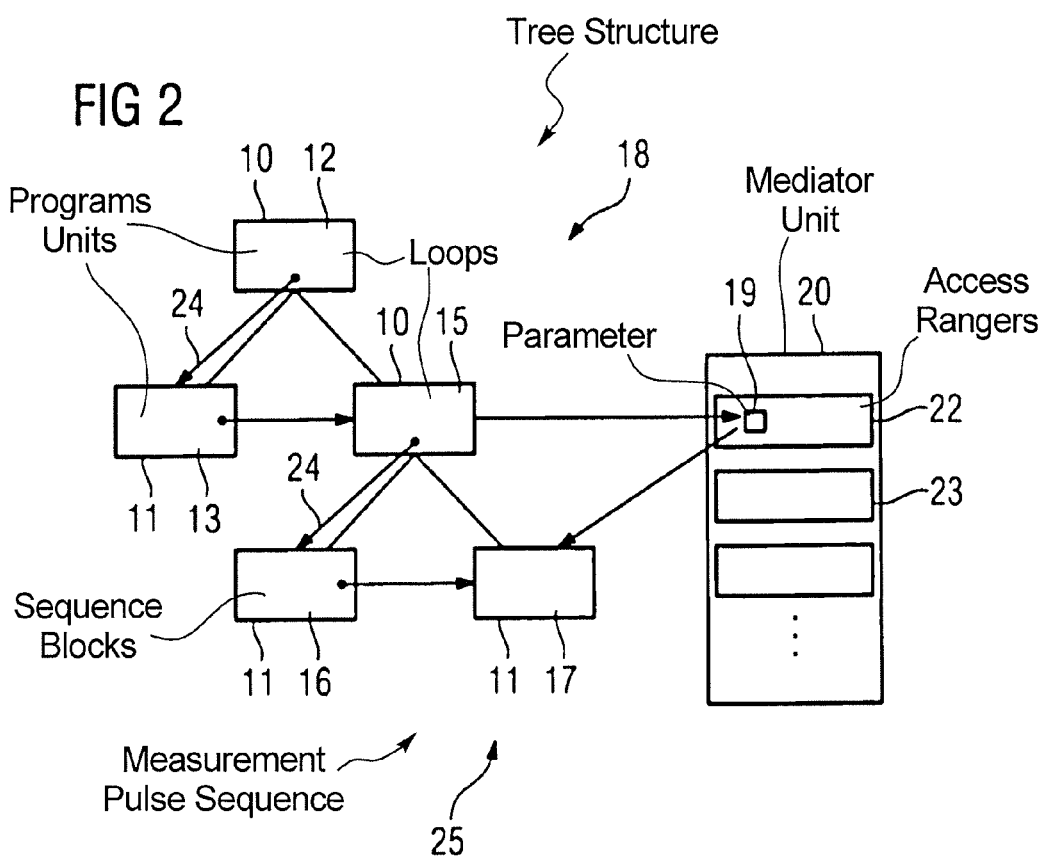

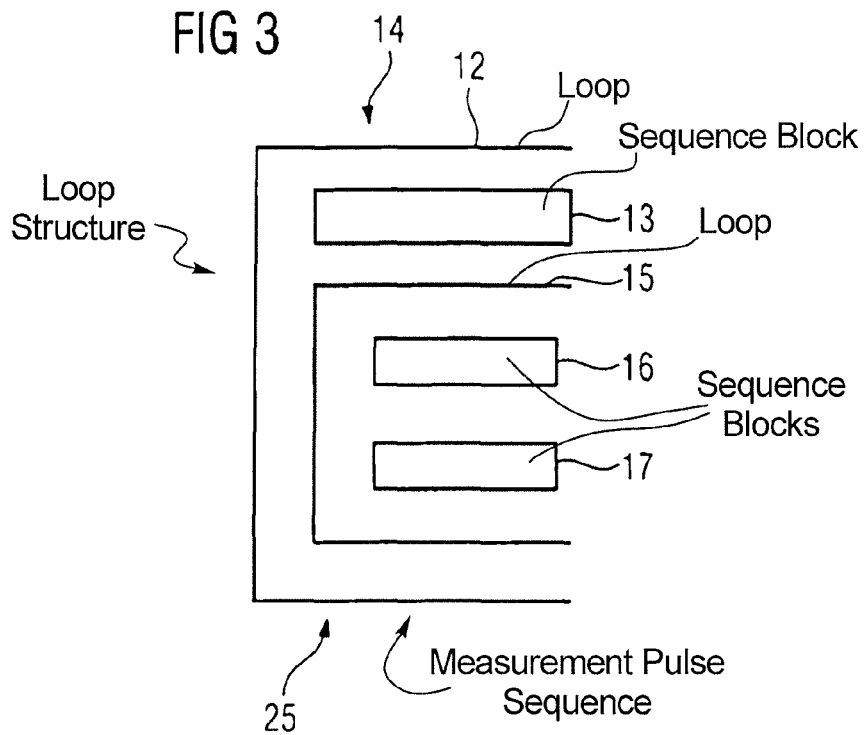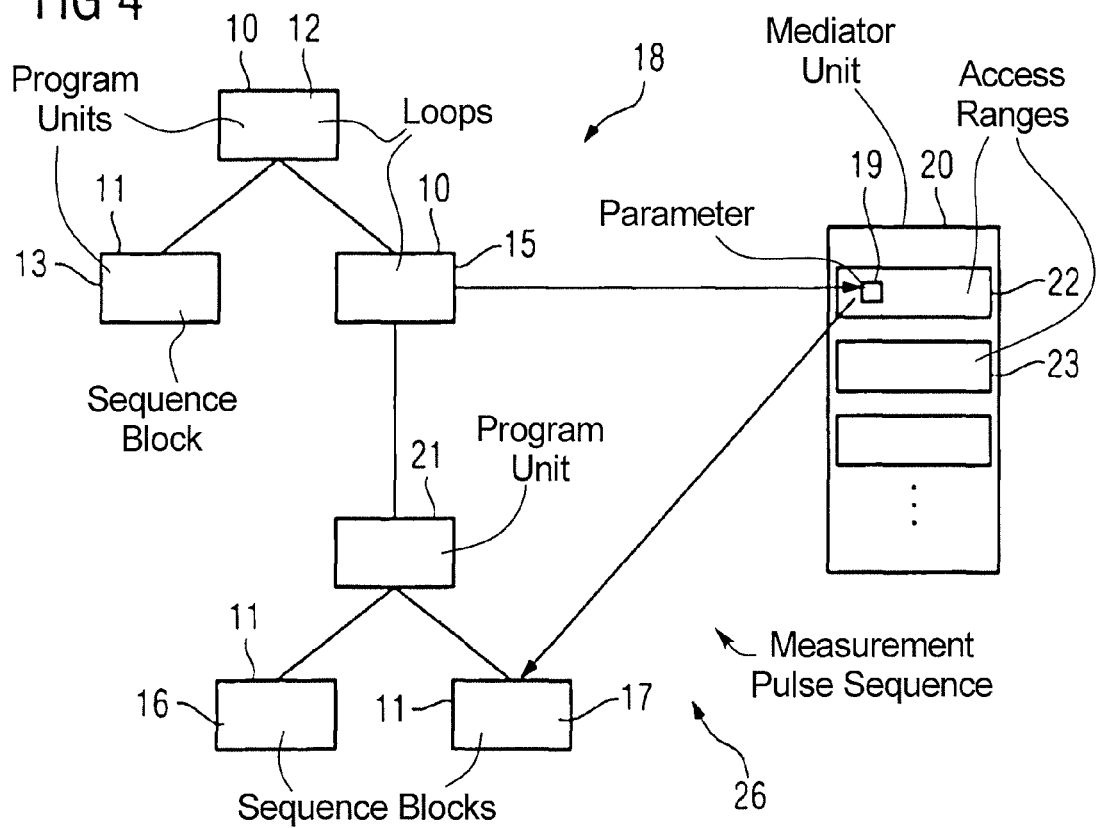

METHOD TO CONFIGURE AT LEAST A PARTIAL RANGE OF A PULSE SEQUENCE OF A MAGNETIC RESONANCE DEVICE

BACKGROUND OF THE INVENTION

1. Field of the Invention

The present invention concerns a method to configure (generate) at least a partial range of a pulse sequence that is used to operate a magnetic resonance device.

2. Description of the Prior Art

In convention methods known for configuration of at least a partial range of a pulse sequence of a magnetic resonance device, most often multiple (different) pulse sequences are generated by means of the magnetic resonance device. The individual pulse sequences each are composed of multiple program units, and the individual pulse sequences differ from one another by being different configured from the different program units. In order to enable and/or to provide modification of a pulse sequence and/or selection of a pulse sequence, configuration of the pulse sequences, the program units and their combination possibilities are implemented in a fixed order (succession). A selection of a desired pulse sequence ensues merely through manual activation of the respective program units and/or the desired combination possibility of the selected program units. The configuration of the pulse sequences, however, is fixed and can be very unclear to an operator.

SUMMARY OF THE INVENTION

An object of the present invention is to provide a method for designing at least one partial range of a pulse sequence of a magnetic resonance device that enables a dynamic and compact design of the pulse sequence.

The invention is based on configuring at least one partial range of a pulse sequence of a magnetic resonance device so that the pulse sequence is composed of at least two different program units.

In accordance with the invention, information and/or at least one parameter is/are exchanged between the individual program units of a pulse sequence by a computerized mediator unit. As used herein, a magnetic resonance device is an imaging device whose operation is based on excitation of nuclear spins of atoms in a resonance region in a detector region of the device, used primarily in medical diagnostics to depict a structure and/or a function of a tissue and/or an organ of a patient in the device. Furthermore, a pulse sequence as used herein means a combination of radio-frequency pulses and magnetic gradient pulses of a predetermined\frequency and/or a predetermined strength, wherein the combination of radio-frequency pulses and magnetic gradient pulses is activated and deactivated multiple times in a predetermined order in the configured section. A program unit encompasses a series of instructions that can be executed by a processor (control unit of the magnetic resonance device) so that a specific functionality can be implemented by means of the program unit. A program unit can be formed by a program loop and/or by a sequence block. A sequence block can include radio-frequency pulses and/or gradient pulses and/or saturation pulses and/or inversion pulses and/or kernels etc. A mediator unit is a computerized unit that is itself configured to control a cooperative behavior (in particular an exchange of information and/or parameters) between at least two objects (in particular two program units), with a direct cooperation between the at least two objects being prevented and the aforementioned cooperation ensuing exclusively via the mediator unit. For this purpose, the mediator unit advantageously has at least one interface for the exchange of information and/or parameters with the individual program units. An information loss and/or a parameter loss between the individual program units, given a modification of a structure and/or the configuration of the pulse frequency, due to the data exchange between the individual program units via the mediator unit can advantageously be prevented by the embodiment according to the invention. For example, an insertion and/or an exchange and/or a removal of individual program units within the structure of the pulse sequence can be conducted and a fully functional data exchange between the individual program units can be maintained.

If at least one loop structure of the pulse sequence is constructed in the method, with little programming effort a dynamic loop structure can be achieved that can be adapted quickly and in particular simply to different requirements of a pulse sequence. This at least one loop structure is advantageously at least partially formed by the at least one partial range of the pulse sequence and is additionally fashioned as a central unit in the construction of pulse sequences in which different sequence blocks and/or program loops are embedded for generation of the pulse sequence.

Furthermore, the aforementioned at least one parameter and/or one item of information can be stored in the mediator unit by a first program unit. The first program unit thus can be used flexibly within different program structures since a direct communication with additional program units for a data exchange is advantageously avoided. The data exchange with additional program units can additionally be designed so as to be independent of an order of additional program units following the program unit.

A particularly flexible program structure and a data exchange between the individual program units that is independent of the program structure can be achieved if at least one parameter and/or one item of information is also retrieved from the mediator unit by a second program unit.

An additional possibility is that at least one access range of the mediator unit is associated with at least one program unit, so unwanted access to an access range of the mediator unit by unauthorized program units can be prevented. A cooperative behavior and/or a data exchange between the individual program units can additionally be affected and/or modified by a change of the access rights for the corresponding program units being produced within the mediator unit. The program units can thus only access a range of the mediator unit when this is permitted to them. As used herein an access range is a range of the mediator unit that only program units authorized for access can access; the access can be in the form of a storage and/or a retrieval of data. It can also be additionally provided that an access right to an access range of the mediator unit is allowed for entire partial ranges of a configuration structure of the pulse sequence, and therefore each program unit of the partial region possesses the same access rights.

In a further embodiment at least one program unit is used that is configured independently of the at least one additional program unit. As used herein configured means specially designed and/or specially fashioned and/or specially programmed. Via this embodiment a dynamic and flexible composition of the individual program units into a pulse sequence can be advantageously achieved. The individual program units can additionally be designed so as to be more compact in that conditions in the design of the program unit for a data exchange between the individual program units can be omitted.

If an order of the individual program units for the pulse sequence is established in the method using a tree structure, a structure for the pulse sequence can be kept compact and therefore a particularly simpler and more straightforward design of the pulse sequence can be achieved that can be modified via slight changes, for example via an exchange of individual program units. As used herein a tree structure is a structure in which sequence blocks and loops occurs as equivalent program units. A portion of the elements within the tree structure act as node elements or parent elements and a portion of the elements act as child elements, wherein the child elements are subordinate to the node elements in an order. The child elements can simultaneously be formed by what are known as leaves that are fashioned as end elements of the tree structure. For every pulse sequence (in particular tree structure) a protocol for its configuration is advantageously, respectively stored so that in particular dynamic and flexible changes in the design of the tree structure can be produced particularly simply in the protocol. The protocol can include rules that can determine a syntax, a semantics and/or a synchronization of a communication between the individual program units. The tree structure can particularly advantageously be constructed dynamically in a preparation phase of the pulse sequence according to specifications from the protocol.

Moreover, the at least one program unit that is used can be configured independently of its position within an order of the tree structure, such that a flexible form of the pulse sequence can be realized.

In a further embodiment of the invention, a selection of the different program units for the pulse sequence is established in a tree structure. The selection of the different program units for a pulse sequence can be modified in a simple manner. In particular, individual program units can be exchanged quickly and in an uncomplicated manner, additional program units can be added and/or already existing program units can be removed from the tree structure. The tree structure advantageously includes only (no more than) the program units that are required for a realization of the desired pulse sequence.

A particularly flexible and dynamic design of the pulse sequence can be achieved by establishing a linking of at least two program units within a tree structure using a pointer element. As used herein a link is a pointer to the additional program unit and/or a reference to the additional program unit. A parent-child relationship and/or a sibling relationship (for example two program units with an identical parent part) are advantageously established within the tree structure by means of the pointer element.

At least one program unit can be arranged within the tree structure of a first pulse sequence at a position that is different than a position of the program unit within the tree structure of a second pulse sequence. The at least one program unit can thus be configured independently of the position that it may occupy within a tree structure, and therefore a flexible arrangement of the at least one program unit—in particular an arrangement of the program unit at different hierarchical levels in the different tree structures—can be achieved in the different pulse sequences.

Furthermore, the invention encompasses from a pulse sequence for a magnetic resonance device with at least one partial region formed by a loop structure that possesses at least two different program units.

The pulse sequence is formed by a computerized mediator unit, wherein an item of information and/or at least one parameter is exchanged between the individual program units by means of the mediator unit. An information loss and/or a parameter loss between the individual program units given a change of a structure and/or of a configuration of the pulse frequency due to the data exchange between the individual program units can be prevented via the mediator unit. For example, an insertion and/or an exchange and/or a removal of individual program units within the structure of the pulse sequence can be conducted and a fully functional data exchange between the individual program units can be maintained.

Furthermore, the pulse sequence has a tree structure and an order of the individual program units is established by means of the tree structure. A structure for the pulse sequence can be kept compact, and therefore an especially simpler and clearer configuration of the pulse sequence can be achieved that can be modified via slight changes, for example by exchanging individual program units.

The interaction of the arrangement of the program units within the tree structure and the exchange of information and/or parameters between the individual program units by the mediator unit enables a particularly dynamic design of the pulse sequence. Otherwise, a design of a pulse sequence—in particular a design of a loop structure—would have to contain all elements and/or units that should ever be relevant for a construction of a pulse sequence (in particular a loop structure) in order to thus made a modification to the loop structure possible in the first place.

BRIEF DESCRIPTION OF THE DRAWINGS

FIG. 1 schematically illustrates a magnetic resonance device.

FIG. 2 illustrates a pulse sequence in a tree structure with a mediator unit.

FIG. 3 shows a design of the pulse sequence from FIG. 2 in a loop structure.

FIG. 4 shows a tree structure of the pulse sequence modified relative to FIG. 2.

DESCRIPTION OF THE PREFERRED EMBODIMENTS

A magnetic resonance device 1 is shown in FIG. 1. The magnetic resonance device 1 has a basic field magnet 2 that generates a strong and constant (homogenous) magnetic field. Furthermore, the magnetic resonance device 1 has gradient coils 3 that are provided to generate a linear gradient field and radio-frequency (RF) coils 4. The gradient coils 3 are controlled by a control unit 5 of the magnetic resonance device 1 via a gradient amplifier 6. The radio-frequency coils 4 are controlled by the control unit 4 via a radio-frequency amplifier 7 and are additionally provided to receive a magnetic resonance signal. The magnetic resonance device 1 also has a screen display 8 by means of which magnetic resonance exposures apparatus results evaluated by the control unit 5 can be presented. Adjustments and/or parameter changes by an operator can be produced via an operating unit 9 of the magnetic resonance device 1.

For a magnetic resonance measurement pulse sequences 25, 26 are generated by the control unit 5 together with the gradient coils 3 and the radio-frequency coils 4. These pulse sequences 25, 26 (FIG. 2 through 4) are constructed from multiple program units 10, 11, wherein the individual program units 10, 11, 21 are formed by a loop 12, 15 or a sequence block 13, 16, 17. A sequence block 13, 16, 17 can be formed by a radio-frequency pulse, a gradient pulse, an inversion pulse, a saturation pulse, a kernel etc. The individual pulse sequences 25, 26 additionally differ from one another with regard to their construction, such that they can be used for different measurements and/or can be adapted to different measurement conditions (FIGS. 2 and 4).

In the following a method is described for a design of at least one partial range of the pulse sequence 25, wherein the partial range is formed by at least one loop structure 14. The loop structure 14 with sequence blocks 13, 16, 17 and/or loops 12, 15 embedded in it essentially forms a central unit of the pulse sequence 25. An example of the loop structure 14 of the pulse sequence 25 is shown in FIG. 3. This loop structure 14 comprises multiple loops 12, 15 and multiple sequence blocks 13, 16, 17, wherein the sequence blocks 13, 16, 17 and an additional loop 15 are embedded in a first loop 12. A first sequence block 13 is initially called within the first loop 12, which sequence block 13 merely has the function of preparing a patient for a magnetic resonance measurement. Since magnetic resonance measurements represent a high noise exposure for the patient, three short knocking sounds are generated in the first sequence block in order to subject prepare the patient for what will happen in the magnetic resonance measurement. An abrupt startling of the patient at the beginning of the magnetic resonance measurement is prevented by the sequence block 13, and a high quality of the magnetic resonance measurement can therefore be achieved. A second loop 15 is subsequently run through within which the actual measurement proceeds. Within this loop 15 different sequence blocks 16, 17 are called that (in the present example) are formed by a sequence block 16 (for a suppression of signals that are caused by fat molecules) and a kernel 17.

In the method to configure the partial range of the pulse sequence 25, the central loop structure 14 is reflected by a tree structure 18 that enables a modular exchange and/or insertion and/or removal of individual program units 10, 11 of the pulse sequence (FIG. 2). Within the tree structure 18 the program units 10 formed by a loop 12, 15 represent essentially equivalent elements with regard to the program units 11 formed from sequence blocks 13, 16, 17.

An exchange of an item of information and/or at least one parameter 19 between the individual program units 10, 11, 21 ensues exclusively by means of a computerized mediator unit 20 as is shown in FIGS. 2 and 3. The computerized mediator unit 20 is configured by programming instructions to control (cause or create) a cooperative behavior of the individual program units 10, 11, 21 relative to one another. For this purpose, data—in particular information and/or parameters 19—can be stored and/or retrieved by the individual program units 10, 11, 21 via an interface (not shown in detail) of the computerized mediator unit 20. At least one parameter 19 and/or item of information is stored in the computerized mediator unit 20 and saved there by a program unit 10, for example by a loop 12. This information and/or this at least one parameter 19 is retrieved by an additional program unit 11—for example by a kernel—so that a correct workflow of the additional program unit 11 is enabled. A direct transfer of the information and/or the parameter 19 between the two program units 10, 11 is thus prevented so that a risk of a possible data loss given a modification of the configuration of the pulse sequence 25, 26 is at least reduced and/or is prevented.

In an alternative embodiment of the invention, an embodiment of the computerized mediator unit 20 that is different than a design pattern is possible at any time.

A simpler and more secure data exchange between two program units 10, 11, 21 is also possible in the loop structure 14 of the pulse sequence 25, 26. The data exchange or the cooperation between the two program units 10, 11, 21—for example the storage of information and/or parameters 19 in the mediator unit and/or the retrieval of information and/or parameters 19 from the computerized mediator unit 20 by the individual program units 10, 11, 21—is thereby independent of a position and/or an arrangement and/or an environment of the respective program unit 10, 11, 21 within a chronological order of the individual program units 10, 11, 21 of the pulse sequence 25, 26 and/or within the tree structure 18 of the pulse sequence 25, 26. In this way a data exchange between the individual program units 10, 11, 21 that runs exclusively via the computerized mediator unit 20 is ensured. For example, additional program units 21 can be interconnected between the two cooperating program units 10, 11 within the tree structure 18 and nevertheless a fully functional data exchange between the two cooperating program units 10, 11 can be maintained by the computerized mediator unit 20 (see FIGS. 2 and 4).

An order of the individual program units 10, 11, 21 (in particular with regard to time) for the pulse sequence 25, 26, in particular for the at least one loop structure 14 of the pulse sequence 25, 26, is established by the tree structure 18. A selection of the different program units 10, 11, 21 for the respective pulse sequence 25, 26 is also established by the tree structure 18 for the respective pulse sequence 25, 26, such that a compact loop structure 14 is achieved that contains only those program units 10, 11, 21 that are currently participating in a configuration and/or design of the pulse sequence 25, 26. A particularly user-friendly and compact structure is hereby enabled that can easily be modified by an operator in that individual program units 10, 11, 21 can be exchanged and/or added and/or removed (FIGS. 2 and 4).

The individual program units 10, 11 can occupy respective positions within the tree structure 18 of a first pulse sequence 25 that is different from the positions of the respective program units 10, 11, 21 of a tree structure 18 of a second pulse sequence 26 (see FIGS. 2 and 4 in this regard). For this the individual program units 10, 11, 21 can be configured independent of their position in the order of the tree structure 18. Furthermore, the individual program units 10, 11, 21 are configured independent of the additional program units 10, 11, 21 of the pulse sequence 25, 26 so that a flexible use of the individual program units 10, 11, 21 of the pulse sequence 25, 26 is enabled independent of their environment within the tree structure 18.

The computerized mediator unit 20 comprises multiple ranges which the individual program units 10, 11, 21 can access. The ranges are respectively formed by an access range 22, 23. An access by the program units 10, 11, 21 to additional access ranges of the computerized mediator unit 20 for which no access right has been associated with said program units 10, 11 is thus suppressed. Furthermore, multiple program units 10, 11, 21 that (for example) are arranged within a hierarchical level within the tree structure 18 or that are derived from a parent element are mutually granted an access right to one or more access ranges 22, 23. The data exchange—in particular the exchange of information and/or of parameters 19—between the individual program units 10, 11, 21 can be controlled in a simple manner by means of the access ranges 22, 23 in that the access rights for the access ranges 22, 23 for the individual program units are administered within the computerized mediator unit 20 and are adapted to new conditions insofar as this is necessary.

A linking of the individual program units 10, 11, 21 within the tree structure 18 is established by pointer elements 24, wherein a pointer element 24 respectively links exactly two program units 10, 11, 21 with one another. The link can thereby establish a parent-child relationship between the individual program units 10, 11, 21 and can establish a sibling relationship between the individual program units 10, 11, 21. A parent-child relationship hereby represents a relationship and/or link between a program unit 10 at a first hierarchical level of the tree structure 18 and an additional program unit 11 at a second hierarchical level that is arranged below the first hierarchical level. A sibling relationship represents a relationship and/or link between two program units 11 within a hierarchical level. The pointer element 24 points to the next program unit 10, 11 in the order. An order of the individual program units 10, 11, 21 within the tree structure 18 is established by means of the pointer elements 24. Within the tree structure 18 the order of the individual program units 10, 11 ensues from top to bottom and from left to right within a hierarchical level of the tree structure.

For every pulse sequence 25, 26, a protocol for its design is stored in a memory unit (not shown in detail). If one of the pulse sequences 25, 26 is selected and/or retrieved by an operator of the magnetic resonance device 1, the tree structure 18 is initially dynamically constructed from specifications of the protocol in a preparation phase of the pulse sequence 25, 26. The tree structure 18 generated in such a manner thus contains only the program units 10, 11, 21 that are required for a realization of the protocol and/or for the construction of this pulse sequence 25, 26. Changes in a configuration of the tree structure 18 that then lead to a modified tree structure 18 in the preparation phase can thus simply be conducted within the respective protocol.

Although modifications and changes may be suggested by those skilled in the art, it is the intention of the inventor to embody within the patent warranted hereon all changes and modifications as reasonably and properly come within the scope of his contribution to the art.

I claim as my invention:

1. A computerized method to configure at least a partial range of a pulse sequence for operating a magnetic resonance device, comprising the steps of:

providing access to a computerized mediator unit by at least two different program units, respectively configured to form respective parts of a pulse sequence for operating a magnetic resonance device, each of said different program units comprising program unit attributes and at least one parameter of the respective program unit; and automatically re-configuring said at least two different program units by automatically exchanging said program unit attributes and said at least one parameter of the respective program units exclusively via a computerized mediator unit, by depositing at least one of said program unit attributes and said at least one parameter of said first of said program unit in said computerized mediator unit, and retrieving, by a second of said program units, said at least one of said program unit attributes and said at least one parameter stored in said computerized mediator unit by said first of said program unit, and then using said at least one of said program unit attributes and said at least one parameter, retrieved by said second of said program units, to modify the part of the pulse sequence for operating a magnetic resonance device that is formed by said second of said program units, dependent on the at least one of said program unit attributes and said at least one parameter retrieved from said first of said program units.

2. A method as claimed in claim 1 comprising in said computerized mediator unit, configuring at least one loop structure of said pulse sequence from said at least two different program units.

3. A method as claimed in claim 1 comprising associating at least one access range of said mediator unit with at least one of said different program units.

4. A method as claimed in claim 1 comprising providing access by at least one of said different program units to said mediator unit that is configured independently of another of said different program units.

5. A method as claimed in claim 1 comprising, in said mediator unit, establishing a sequence of said different program units in said pulse sequence using a tree structure.

6. A method as claimed in claim 5 comprising providing at least one of said different program units to said mediator unit that is configured independently of a position occupied within said tree structure by said at least one of said different program units.

7. A method as claimed in claim 5 comprising using said tree structure to establish selection of said different program units for inclusion in said pulse sequence.

8. A method as claimed in claim 5 comprising establishing a link between at least two different program units in said tree structure using a pointer element.

9. A method as claimed in claim 5 comprising arranging at least one programming unit within said tree structure for a first pulse sequence at a position that is different from a position of said at least one program unit within a tree structure for a second pulse sequence.

* * * * *